(12) United States Patent
Zhu et al.

(10) Patent No.: US 6,195,870 B1
(45) Date of Patent: Mar. 6, 2001

(54) COMPRESSIVE ANNEALING OF SUPERCONDUCTIVE TAPES

(75) Inventors: Yuntian T. Zhu, Los Alamos; Patrick S. Baldonado, El Rito; John F. Bingert, Jemez Springs; Terry G. Holesinger; Dean E. Peterson, both of Los Alamos, all of NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 09/249,476

(22) Filed: Feb. 12, 1999

Related U.S. Application Data

(60) Provisional application No. 60/074,717, filed on Feb. 13, 1998.

(51) Int. Cl.⁷ .................................................. H01L 39/24
(52) U.S. Cl. .................... 29/599; 174/125.1; 174/126.2; 505/231; 505/431; 505/501
(58) Field of Search .............................. 29/599; 505/501, 505/482, 742, 431, 231; 174/125.1, 126.2

(56) References Cited

U.S. PATENT DOCUMENTS

| | | | |
|---|---|---|---|
| 5,223,478 | * | 6/1993 | Whitlow et al. |
| 5,552,376 | * | 9/1996 | Kato et al. ............................. 29/599 |
| 5,639,714 | * | 6/1997 | Hikata et al. ......................... 29/599 |
| 5,674,814 | * | 10/1997 | Lanagan et al. ...................... 29/599 |

OTHER PUBLICATIONS

W. R. Blumenthal et al., "Deformation State Effects on the $J_c$ of BSCCO Tapes." Physica C 260 (1996), pp. 33–40.

K. Heine et al., "High–Field Critical Current Densities in $Bi_2Sr_2Ca_1Cu_2O_{8+x}$/Ag Wires." Appl. Phys. Lett. 55 (23) Dec. 1989, pp. 2441–2443.

P. Haldar et al, "Enhancement in Critical Current Density of Bi–Pb–Sr–Ca–Cu–O Tapes by Thermomechanical Processing: Cold Rolling Versus Uniaxial Pressing." Appl. Phys. Lett. 60 (4), Jan. 1992, pp. 495–497.

S. X. Dou et al., "AG–Sheathed Bi(Pb) SrCaCuO Superconducting Tapes." Supercond. Sci. Technol. 6 (1993), pp. 297–314.

Wai Lo et al., "Texturing and Texture–Induced Intergranular Critical State Anisotropy of Superconducting $(Bi,Pb)_2Sr_2Ca_2Cu_3O_x$ Ceramics." J. Materials Sci. 29 (1994), pp. 3897–3905.

Xiaoming Yang et al., "Alignment of Grains in $Bi_{1.6}Pb_{0.4}Sr_2Ca_2C_3O_x$ by Hot Deformation." Supercond. Sci. Technol. 6 (1993), pp. 269–275.

J. Jackiewicz et al., "Influence of the Constant Load Sintering on the Improvement of the Transport Critical Current in $Ag–(Bi,Pb)_2Sr_2Ca_2Cu_3O_x$ Tape Form Conductor." J. Alloys and Compounds, 195 (1993), pp. 165–168.

J. G. Noudem et al., "Optimization of Texturing Process by Hot Pressing of Bi–Pb–Sr–Ca–Cu–O (2223) Ceramics." Physica 3 230 (1994), pp. 42–50.

M. Daumling et al., "Hot Deformation Effects on Critical Currents in $(Bi,Pb)_2Sr_2Ca_2Cu_3O_x$ Silver–Sheathed Tapes." Physica C 250 (1995), pp. 30–38.

W. Pachla et al., "Hot Pressing of Bi(Pb)–Sr–Ca–Cu–O Superconducting Pellets." Supercond. Sci. Technol. 7 (1994), pp. 820–823.

(List continued on next page.)

*Primary Examiner*—Carl J. Arbes
(74) *Attorney, Agent, or Firm*—Bruce H. Cottrell

(57) ABSTRACT

Superconductor tapes are annealed under uniaxial pressure, such a compressive annealing yielding significant improvement in the resultant critical current density. This thermomechanical processing technique obtains improved critical currents with fewer processing steps.

5 Claims, 2 Drawing Sheets

OTHER PUBLICATIONS

G. Grabert et al., "The Influence of Processing Pressure on the Formation of the High-$T_c$ 2223 Phase In Bi–Pb–Sr–Ca–Cu–O Superconductors." J. of Materials Sci. 29 (1994), pp. 3419–34224.

Hiroshi Ikeda et al., "Preparation of Pb–Doped Bi–Sr–Ca–Cu–O Superconductors by a Hot–Press Method." Japanese J. of Appl. Physics, vol. 29, No. 3, Mar. 1990, pp. L 430–L 433.

Ryozo Yoshizaki et al., "Properties of Pb–Doped Bi–Sr–Ca–Cu–O Superconductors Prepared by a Hot–Press Method." Japanese J. of Appl. Physics., vol. 29, No. 5, May 1990, pp. L 753–L 756.

G. Celotti et al., "Evaluation of Strucure–Related Parameters of Hot–Pressed BISCCO (2223) Phase." Physica C 225 (1994), pp. 346–352.

Kang–Ho Song et al., "Effect of Hot–Pressing on the Bi–Pb–Sr–Ca–Cu–O System." J. Am. Ceram. Soc. 74 (10), pp. 2577–2582 (1991).

Yanwei Ma et al., "An Investigation of Hot Pressing of Ag–Clad Bi (2223) Superconducting Tapes." Supercond. Sci. Technol. 9 (1996), pp. 796–800.

A. Perin et al. "Hot Rolling of Silver–Sheathed Bi (2223) Tapes." Physica C 216 (1993), pp. 339–344.

Xiaoming Yang et al., "Hot Rolling of $Bi_{1.6}Pb_{0.4}Sr_2Ca_2Cu_3O_x$ Superconducting Pellets." Supercond. Sci. Technol. 6 (1993), pp. 343–348.

Anna Tampieri et al., "Densification of $Bi_{1.8}(Pb)_{0.35}Sr_{1.9}Ca_{2.1}Cu_3O_x$ and Texture Development Through Sinter–Forging." Jpn. J. Appl. Phys. vol. 32 (1993), pp. 4490–4495.

V. Rouessac et al., "Processing and Superconducting Properties of Highly Textured Bi(Pb)–2223 Ceramics by Sinter–Forging." Physica C 268 (1996), pp. 225–232.

S. R. Arrasmith et al., Rapidly Textured $Bi_2Sr_2CaCu_2O_8$. J. Mater. Res., vol. 8, No. 6, Jun. 1993, pp. 1247–1257.

* cited by examiner

COMPRESSIVE ANNEALING OF SUPERCONDUCTIVE TAPES

This application claims the benefit of U.S. Provisional Application No. 60/074,717, filed Feb. 13, 1998.

FIELD OF THE INVENTION

The present invention relates to superconductive tapes and more particularly to superconductive tapes prepared under low pressure compressive annealing. This invention is the result of a contract with the Department of Energy (Contract No. W-7405-ENG-36).

BACKGROUND OF THE INVENTION

The discovery of high temperature superconductive materials in the late 1980's was soon followed by a desire to form such materials into tapes or similar shapes. Ideally such tapes should be physically strong, flexible, highly conductive and able to withstand strong magnetic fields without loss of current carrying capacity.

Processes generally referred to as "powder in a tube" have been developed. For example, a general process of fabricating superconductive tape involves initially preparing a superconductive powder, filling a tube or pipe of silver with the superconductive powder, sealing the pipe or tube, subjecting the pipe or tube to reducing or deforming operations to form tape, and finally sintering the reduced tape at high temperatures.

Efforts to further develop conventional thermomechanical processing methods have been largely unsuccessful in improving the critical current density, $J_c$, of BSCCO superconducting tapes. Limited current density remains an obstacle in the commercial application of BSCCO high temperature superconductors. Conventional processing involves iterative cycles of mechanical deformation to develop texture and reduce porosity followed by thermal annealing to react components, to relieve stress and to heal microcracks caused by the deformation. Texture and deformation hardening and cracking may limit the ability to obtain the desired grain texture through deformation alone. In addition, the oxide core density of the superconductive tapes decreases during the annealing, causing $J_c$ to decrease as well.

It is an object of the present invention to provide a process of improving critical current density in superconductive tapes by a low pressure compressive annealing of the tapes.

It is a further object of the invention to provide a process of low pressure compressive annealing of superconductive tapes in the absence of tape deformation, i.e., where such low pressure compressive annealing does not subject the tapes to deformation.

SUMMARY OF THE INVENTION

To achieve the foregoing and other objects, and in accordance with the purposes of the present invention, as embodied and broadly described herein, the present invention provides a process of preparing a high temperature oxide superconductive tape including heating an oxide superconductive precursor tape at ambient pressure and at temperatures of from about 810° C. to about 840° C. for a sufficient period of time, pressing said oxide superconductive precursor tape under high pressure of greater than about 0.1 GPa at ambient temperature, and heating said oxide superconductive precursor tape under low compressive uniaxial pressures insufficient to deform said oxide superconductive precursor tape at temperatures of from about 810° C. to about 840° C. for periods of time from about 100 hours to about 200 hours.

In one embodiment of the present invention, the high temperature oxide superconductive tape includes a bismuth-strontium-calcium-copper oxide as the superconductive material.

DETAILED DESCRIPTION

The present invention is concerned with preparation of superconductive tapes such that the superconductive tapes have enhanced critical current densities.

In the process of the present invention, superconductive tapes are annealed under uniaxial low pressures. Such a process promotes texture formation, enhances formation kinetics of the superconducting phase and prevents de-sintering of the oxide superconductive material. Results of superconductive tapes prepared under such a low pressure compressive annealing have shown significant improvement in critical current density. Additionally, the present process can avoid the multiple step iterative cycles of mechanical deformation followed by thermal annealing and thus reduce processing time and costs.

By the term "uniaxial" is meant that the pressure is applied in a single axial direction. The single axial direction is generally perpendicular to the surface of the superconductive tapes.

The process employs low compressive pressure or stress on the superconductive tape during the entire annealing process to develop superconductive phase and texture. The process differs from hot pressing and hot rolling in that such hot pressing and hot rolling employ a large compressive/shear stress to deform the tape in a short period to mechanically increase the density and the texture and then no pressure is used during the subsequent thermal annealing during which time the density and texture may be decreased.

By "low compressive pressure" is generally meant a pressure that does not result in measurable deformation of the superconductive tapes. Generally, such pressures can be in the range of from about 1 MPa to about 25 MPa, preferably from about 1 MPa to about 15 MPa.

Figure 1:
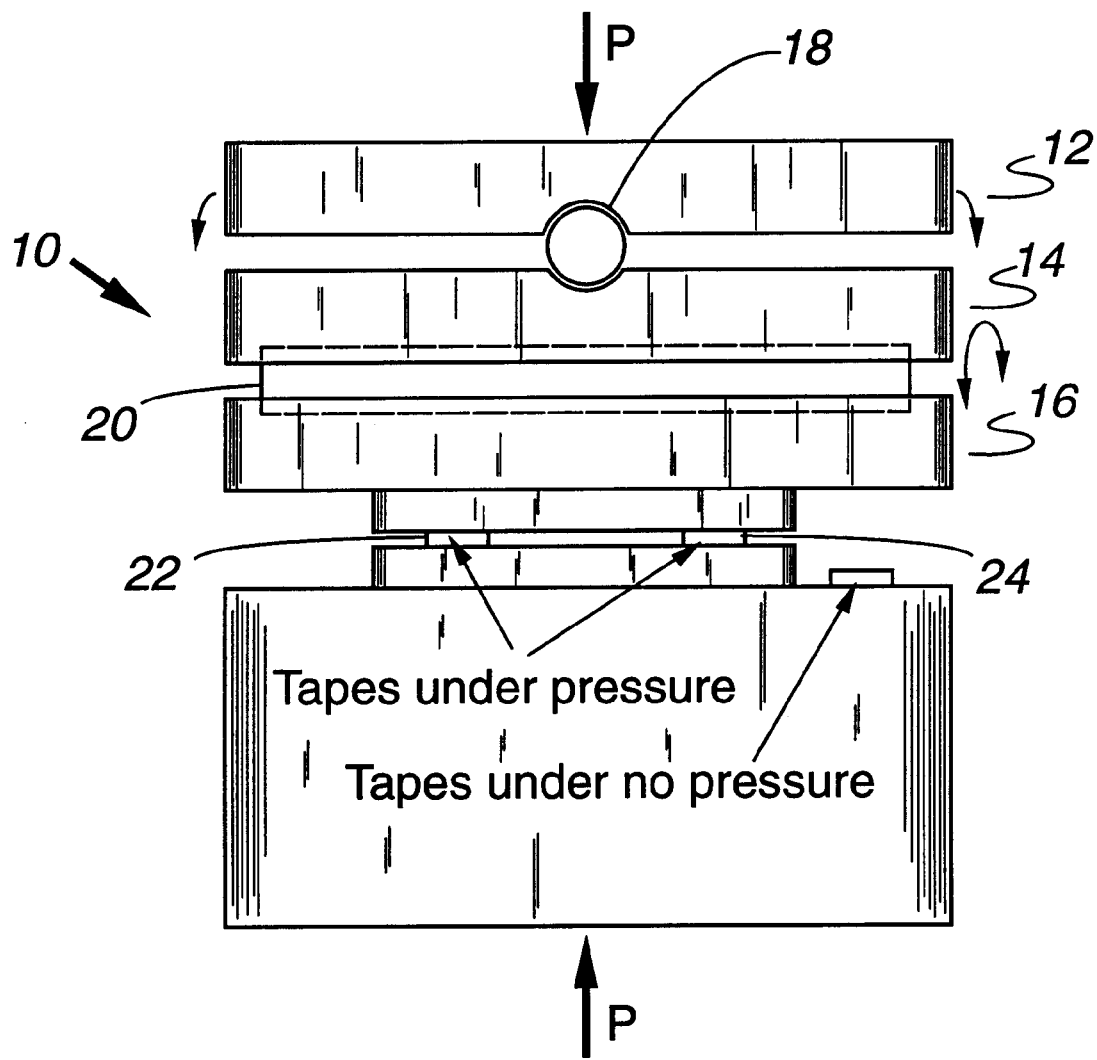
FIG. 1 shows a press useful in applying the low compressive pressures on the superconductive tapes during processing in accordance with the present invention.

FIG. 1 shows a press useful in applying the low compressive pressures on the superconductive tapes during processing in accordance with the present invention. Apparatus 10 shows three plates 12, 14, and 16 with individual pairs of the plates separated by a roller 18 or 20 as shown. This design is effective in maintaining uniform pressure on the tape samples (shown as 22 and 24).

The thermomechanical processing technique of this invention can be used for processing of superconductive tapes or may be used for the joining together of multiple superconductive tape pieces.

The present superconductive article generally includes a high temperature oxide superconductive material such as a high temperature superconductive oxide. By "high temperature" is generally meant that such a material exhibits superconductivity at temperatures above about 35 K, and preferably exhibits superconductivity at the temperature of liquid nitrogen, about 78 K.

In preparing the superconductive tape including a high temperature superconductive oxide, a superconductive oxide core can be prepared from bismuth-based superconductive materials such as a bismuth-strontium-calcium-copper oxide, e.g., $Bi_2Sr_2Ca_2Cu_3O_x$ (Bi-2223) or $Bi_2Sr_2Ca_1Cu_2O_x$, (Bi-2212) (x being well known to those skilled in the art)or a bismuth-lead-strontium-calcium-copper oxide, e.g., $(Bi_{2-x}Pb_x)Sr_2Ca_2Cu_3O_x$ (x being well known to those skilled in the art), from rare earth-based superconductive materials including yttrium-based superconductive materials such as a yttrium-barium-copper oxide, e.g., $YBa_2Cu_3O_x$(x being well known to those skilled in the art), or from thallium-based superconductive materials such as a thallium-barium-copper oxide, e.g., $Tl_2Ba_2Ca_2Cu_3O_x$(x being well known to those skilled in the art). The superconductive tape preferably includes Bi-2223 which can be of any composition suitable in achieving an eventual superconductive tape, e.g., a composition of $Bi_{1.9}Pb_{0.4}Sr_2Ca_{2.2}Cu_3O_{10+x}$ where x is less than about 1 is especially preferred. Other minor variations in precise composition may be suitable.

Numerous other oxide superconductive compositions are well known as exemplified by $MBa_2Cu_3O_x$ where M is neodymium (Nd), dysprosium (Dy), erbium (Er), thulium (Tm), gadolinium (Gd), samarium (Sm), europium (Eu), ytterbium (Yb), holmium (Ho) or mixtures thereof, $La_{2-x}Sn_xCuO_4$, doped with fluorine, $YBa_2Cu_3O_x$ doped with fluorine, $EuBa_2(Cu_{1-y}M_y)_3O_x$ where M is chromium (Cr), manganese (Mn), cobalt (Co), nickel (Ni) or zinc (Zn), and $BaKBiO_3$. Those acquainted with the art will appreciate that the list of superconductors, especially high temperature ceramic-type superconductors oxides, is long and continues to grow on a regular basis and that basic high temperature ceramic-type superconductor oxide compositions may generally be doped with various metals, metalloids and non-metals. The purpose of the present invention is to provide an improved process of forming superconductive tape with any of the particular superconductive oxide materials.

During the formation of a Bi-2223 phase from its precursors, the well-aligned nuclei of the Bi-2223 phase (with the ab planes perpendicular to the compressive stress) will be favored thermodynamically, and thus grow faster. In addition, since the well-aligned grains are thermodynamically more stable than the poorly aligned grains, the well-aligned grains will grow by consuming the poorly aligned grains if the Bi-2223 phases are already formed. Both of these will lead to higher amounts of texture. Also, the compressive stress will prevent the decrease in oxide core density during the annealing. The $J_c$ values of these tapes sintered under uniaxial pressure were significantly higher.

The superconductive tape of the present invention includes a metallic tube or sheath that can generally be of any metal that is chemically compatible and inert with the oxide superconductive material. Generally, silver is the preferred metal for the tape although silver alloys such as an alloy of silver and gold or silver and those elements which provide additional stiffness, such as aluminum, magnesium, hafnium, titanium, holmium and the like by oxide dispersion strengthening (i.e., ODS-Ag alloys), gold and gold alloys as well as a gold- or silver-plated metal. Other noble metals such as platinum may also be used as the casing or sheath.

As a precursor material in the present invention a metal sheathed, e.g., a silver sheathed, superconductive oxide precursor is formed by inserting the desired superconductive oxide precursor mixture into a metal tube and such a precursor filled metal tube is rolled or otherwise reduced in size to yield a superconductive oxide precursor tape. Preparation of such a precursor material is well known to those skilled in the art.

A pretreatment of the starting precursor material is generally conducted for best results. Such a pretreatment can include heating at temperature between about 810° C. and about 840° C., preferably from about 825° C. and about 835° C., more preferably about 830° C., for periods of time from about 1 day to about 3 days at ambient pressure under an atmosphere including a minor portion of oxygen (i.e., less than about 50 percent by volume oxygen), generally from about 5 to about 20 percent by volume oxygen, remainder an inert gas such as argon or nitrogen. The atmospheric composition may be varied for optimal results depending upon the particular superconductive oxide material used. In the case of the particular Bi-2223 precursor material used in the embodiments set forth herein, the oxygen preferably makes up about 10 percent by volume of the atmosphere during the pre-annealing. Other compositions may require or prefer another oxygen content.

The superconductive tape can next be pressed under an large pressure of about 1 GPa to about 3 GPa at room temperature (about 25° C.). This is carried out to reduce any voids or pores present within the sample being processed. These voids or pores may be caused at least partially by the pretreatment process.

Then, the superconductive tape is annealed under a low compressive uniaxial pressure of about 4 MPa to about 8 MPa at elevated temperatures of between about 810° C. and about 840° C., preferably from about 825° C. and about 835° C., more preferably about 830° C., for periods of time from about 5 to about 10 days, preferably about 7 days, under ambient air or under an atmosphere including an oxygen partial pressure of about 0.14 atmospheres (atm), with the remainder of an inert gas such as nitrogen or argon.

Preferably, the oxygen partial pressure is maintained between about 0.11 atm and 0.21 atm during this stage.

The present invention is more particularly described in the following example which is intended as illustrative only, since numerous modifications and variations will be apparent to those skilled in the art.

EXAMPLE

A superconductive powder of nominal composition $Bi_{1.9}Pb_{0.4}Sr_2Ca_{2.2}Cu_3O_{10+x}$ where x is less than about 1 was inserted into a silver tube of diameter about 1 centimeter (cm), the tube end was sealed and the tube was reduced in size by rolling to about 0.15 millimeter (mm) in thickness and about 1.8 mm in width forming an oxide superconductor precursor tape. The precursor tape was pre-annealed by heating under an atmosphere of about 10 percent by volume oxygen, remainder nitrogen, from room temperature to about 830° C. at a rate of about 1° C. per minute, holding at 830° C. for about 35 hours and cooling down to room temperature at a rate of about 1° C. per minute. The sample was then cold-pressed (room temperature) at about 3 gigapascals (GPa). Then, the sample was annealed under a low uniaxial compressive force of about 5 megapascals (MPa) by heating under an atmosphere of air (with an oxygen partial pressure of about 0.14 atm), from room temperature to about 830° C. at a rate of about 1° C. per minute, holding at 830° C. for about 153 hours and cooling down to room temperature at a rate of about 1° C. per minute. The apparatus shown in FIG. 1 was used to apply the uniaxial pressure.

The superconductive tape prepared by annealing under uniaxial compressive pressure demonstrated properties as follows: $J_c$=15,000 amperes per square centimeter (A/cm$^2$) and $I_c$=10.88 amperes (A).

In comparison, a superconductive tape prepared by annealing at the identical temperatures and for the identical periods of time under ambient (atmospheric) pressure demonstrated properties as follows: $J_c$=3,100 amperes per square centimeter (A/cm$^2$) and $I_c$=4.31 amperes (A).

In addition, the scanning electron micrographs (SEM) of the superconductive tapes prepared under both uniaxial pressure and ambient pressure showed that the superconductive tapes prepared under ambient pressure exhibited expansion or bloating of the superconductive oxide core while the superconductive tapes prepared under uniaxial pressure were unaffected with relatively uniform cores.

Figure 2:
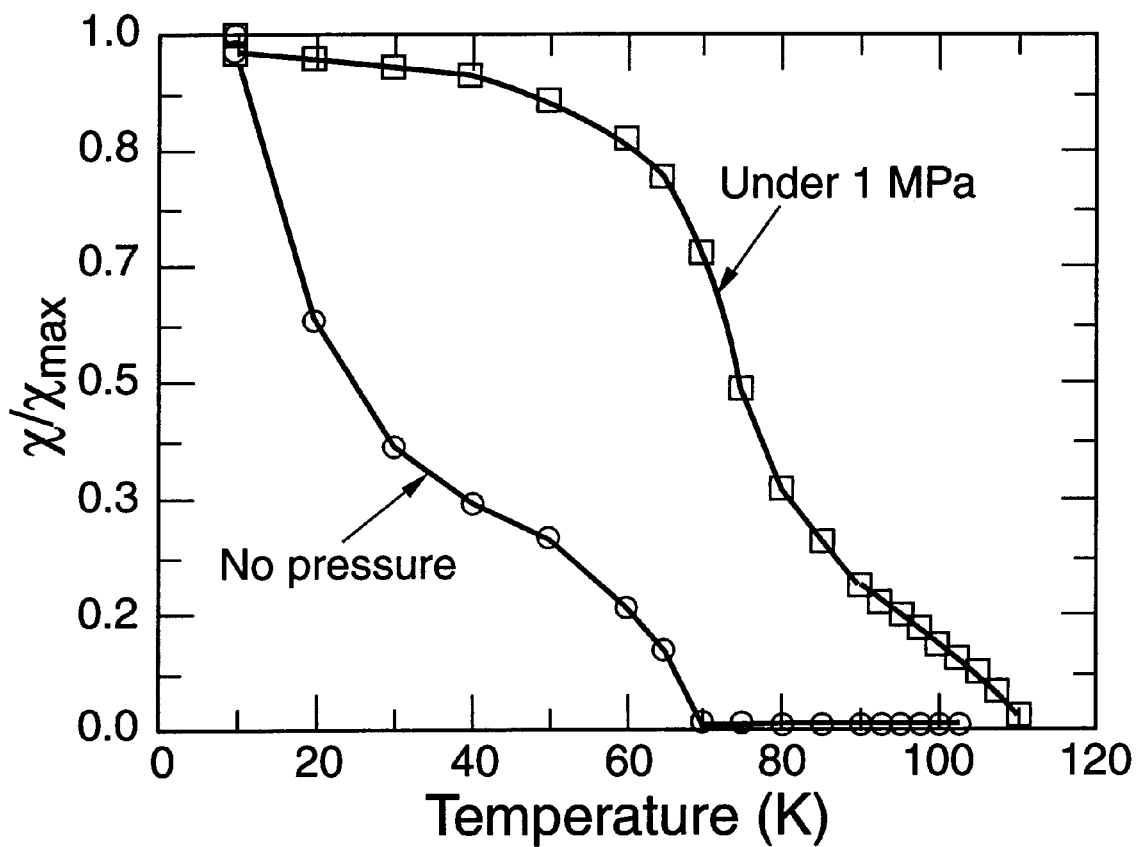
FIG. 2 shows the fraction of $\chi/\chi_{max}$ caused by each superconductive phase where the ratio can be roughly considered as the volume fraction of that phase with respect to the total amount of superconducting phases as measured by a SQUID.

To investigate the effect of compressive uniaxial pressure exerted by the compressive anneal process on the formation kinetics of Bi-2233 phase, a tape under a compressive uniaxial pressure of 1 MPa and a control tape under no pressure were annealed at 820° C. in 0.14 atmosphere oxygen partial pressure for 135 hours. A Superconducting Quantum Interference Device (SQUID) magnetometer (from Quantum Design, San Diego, Calif.) was used to check the superconducting phase fraction of the annealed tapes. The sample was first zero-field cooled to 10 K and measurement was carried out in 10 Oe field while the sample was warmed from 10 K to 110 K. FIG. 2 shows the susceptibility normalized to its 10 K value $(\chi_{max})$, $\chi/\chi_{max}$) vs. temperature for both samples. The fraction of $\chi/\chi_{max}$ due to each superconducting phase can be roughly considered as the volume fraction of that phase with respect to the total amount of superconducting phases. The sample annealed under the compressive uniaxial pressure of 1 MPa consists of mostly Bi-2212 precursor phase ($T_c$~80–90 K) with about 25% Bi-2223 phase ($T_c$~110 K). In contrast, the sample annealed under no pressure contains mostly Bi-2201 and Bi-2212 phases with almost no Bi-2223 phase. This result clearly indicated that the compression anneal processing significantly enhanced the formation kinetics of the Bi-2223 phase.

Although the present invention has been described with reference to specific details, it is not intended that such details should be regarded as limitations upon the scope of the invention, except as and to the extent that they are included in the accompanying claims.

What is claimed is:

1. A process of preparing a high temperature oxide superconductive tape comprising:

heating an oxide superconductive precursor tape at ambient pressure and at temperatures of from about 810° C. to about 840° C. for a period of time;

pressing said oxide superconductive precursor tape under high pressure of greater than about 0.1 Gpa at ambient temperature;

heating said oxide superconductive precursor tape under low uniaxial pressures insufficient to deform said oxide superconductive precursor tape at temperatures of from about 810° C. to about 840° C. for periods of time from about 100 hours to about 200 hours to form a resultant high temperature oxide superconductive tape, whereby said resultant high temperature oxide superconductive tape is characterized as having a larger critical current density ($J_c$) and critical current ($I_c$) than an identical high temperature oxide superconductive tape processed in the absence of low uniaxial pressure during heating.

2. The process of claim 1 wherein said low uniaxial pressures are from about 1 MPa to about 25 MPa.

3. The process of claim 1 wherein said high temperature oxide superconductive tape includes Bi-2223.

4. The process of claim 2 wherein said high temperature oxide superconductive tape includes Bi-2223.

5. The process of claim 1 wherein said density under low uniaxial pressures is conducted under an oxygen partial pressure of between about 0.11 atm and 0.21 atm.

* * * * *